(12) United States Patent
Lee

(10) Patent No.: US 12,414,233 B2
(45) Date of Patent: Sep. 9, 2025

(54) CIRCUIT BOARD

(71) Applicant: LG INNOTEK CO., LTD., Seoul (KR)

(72) Inventor: Dong Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 405 days.

(21) Appl. No.: 17/793,100

(22) PCT Filed: Jan. 13, 2021

(86) PCT No.: PCT/KR2021/000455
§ 371 (c)(1),
(2) Date: Jul. 15, 2022

(87) PCT Pub. No.: WO2021/145664
PCT Pub. Date: Jul. 22, 2021

(65) Prior Publication Data
US 2023/0047621 A1    Feb. 16, 2023

(30) Foreign Application Priority Data

Jan. 16, 2020 (KR) .......................... 10-2020-0006073

(51) Int. Cl.
*H05K 1/11* (2006.01)
*H05K 1/02* (2006.01)
(Continued)

(52) U.S. Cl.
CPC .............. *H05K 1/115* (2013.01); *H05K 1/05* (2013.01); *H05K 1/111* (2013.01); *H05K 1/181* (2013.01);
(Continued)

(58) Field of Classification Search
CPC . H05K 1/115; H05K 1/05; H05K 1/11; H05K 1/181; H05K 3/38; H05K 3/40;
(Continued)

(56) References Cited

U.S. PATENT DOCUMENTS 5,258,094 A * 11/1993 Furui ................... H05K 3/4614
                                              430/318
6,809,269 B2 * 10/2004 Fuller, Jr .............. H05K 3/462
                                              174/262
(Continued)

FOREIGN PATENT DOCUMENTS

JP     2019-025859    2/2019
KR    20-0200228     10/2000
(Continued)

OTHER PUBLICATIONS

International Search Report dated May 4, 2021 issued in Application No. PCT/KR2021/000455.

*Primary Examiner* — Ishwarbhai B Patel
(74) *Attorney, Agent, or Firm* — KED & ASSOCIATES, LLP

(57) ABSTRACT

A circuit board according to the embodiment includes a first substrate including a first insulating layer and a first pad disposed on an upper surface of the first insulating layer; a second substrate including a second insulating layer including a via hole and a metal layer formed on upper and lower surfaces of the second insulating layer and an inner wall of the via hole; a third insulating layer disposed between the first substrate and the second substrate and having a first opening in a region overlapping the via hole; a via filling the via hole and disposed on the first pad exposed through the opening of the third insulating layer; and a second pad disposed on the via and the metal layer disposed on an upper surface of the second insulating layer.

17 Claims, 9 Drawing Sheets

(51) Int. Cl.
*H05K 1/05* (2006.01)
*H05K 1/18* (2006.01)
*H05K 3/38* (2006.01)
*H05K 3/40* (2006.01)

(52) U.S. Cl.
CPC ............... *H05K 3/38* (2013.01); *H05K 3/40* (2013.01); *H05K 1/0207* (2013.01)

(58) Field of Classification Search
CPC . H05K 2201/09481; H05K 2201/0959; H05K 2201/096; H05K 3/4623; H05K 1/0207; H05K 3/381; H05K 3/4038; H01L 23/49822
See application file for complete search history.

(56) References Cited

U.S. PATENT DOCUMENTS

| | | | | |
|---|---|---|---|---|
| 7,915,541 B2* | 3/2011 | Koide | ................ | H05K 3/4641 174/262 |
| 8,143,531 B2* | 3/2012 | Miki | ................ | H01L 23/49822 174/262 |
| 9,066,458 B2* | 6/2015 | Kung | ................ | H05K 3/4007 |
| 9,161,454 B2* | 10/2015 | Tseng | ................ | H05K 3/06 |
| 9,532,469 B2* | 12/2016 | Baba | ................ | H05K 1/14 |
| 10,941,323 B2 | 3/2021 | Hirai et al. | | |
| 2004/0118596 A1* | 6/2004 | Fuller, Jr. | ................ | H05K 3/462 174/262 |
| 2004/0154930 A1 | 8/2004 | Shinozaki | | |
| 2006/0223236 A1* | 10/2006 | Nomura | ................ | H05K 3/4679 257/E23.065 |
| 2012/0073863 A1 | 3/2012 | Kang et al. | | |
| 2012/0152753 A1 | 6/2012 | Lee et al. | | |
| 2013/0153269 A1* | 6/2013 | Takahashi | ................ | H05K 3/368 174/250 |

FOREIGN PATENT DOCUMENTS

| | | |
|---|---|---|
| KR | 10-2004-0073387 | 8/2004 |
| KR | 10-2012-0032937 | 4/2012 |
| KR | 10-2012-0069987 | 6/2012 |
| KR | 10-2019-0012849 | 2/2019 |
| KR | 10-2019-0052458 | 5/2019 |
| KR | 10-2019-0124616 | 11/2019 |

* cited by examiner

[FIG. 1]
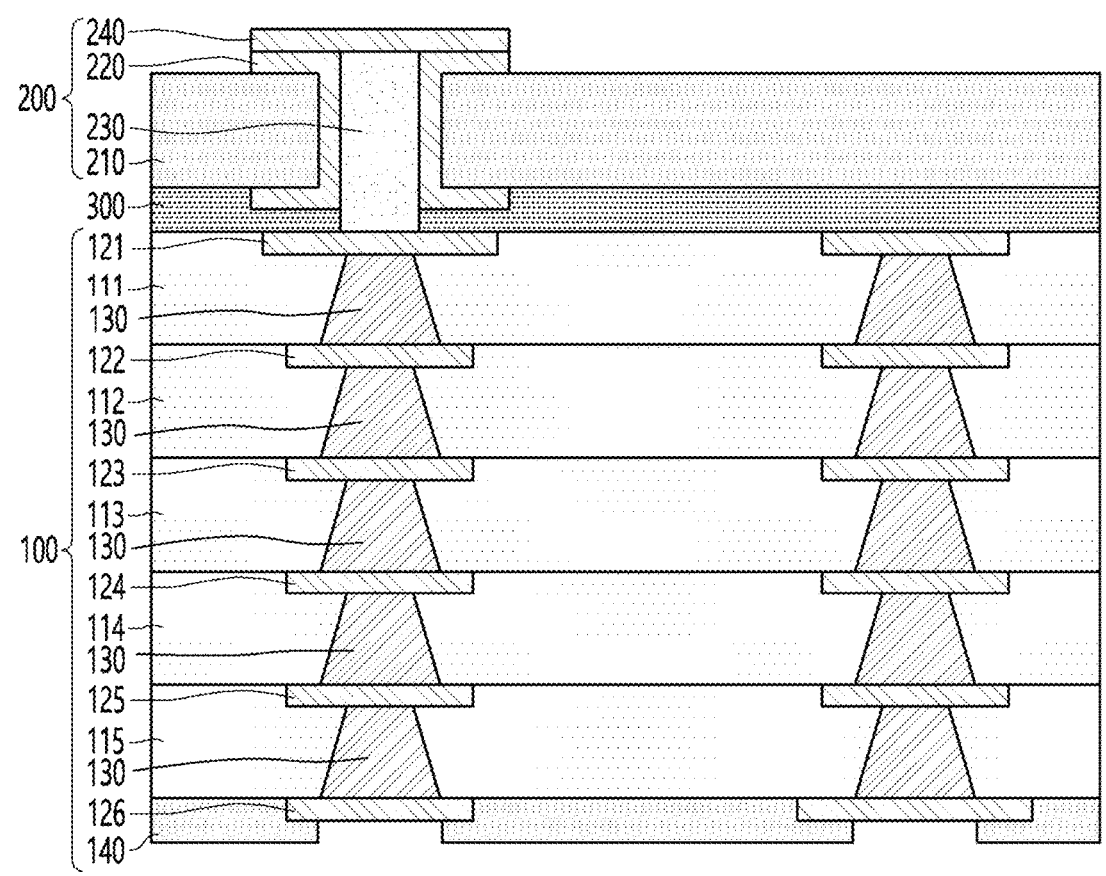

[FIG. 2]
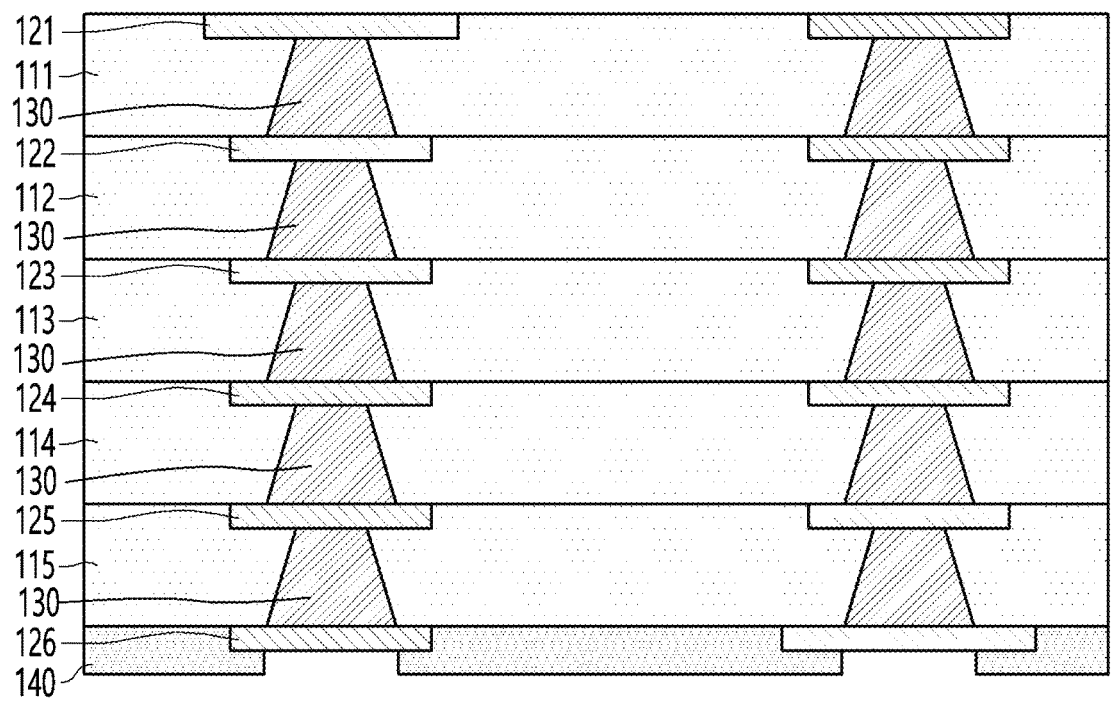
[FIG. 3]
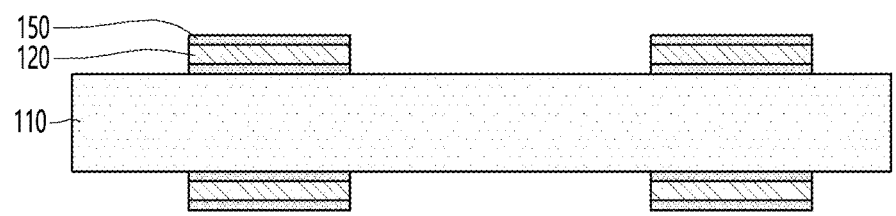
[FIG. 4]
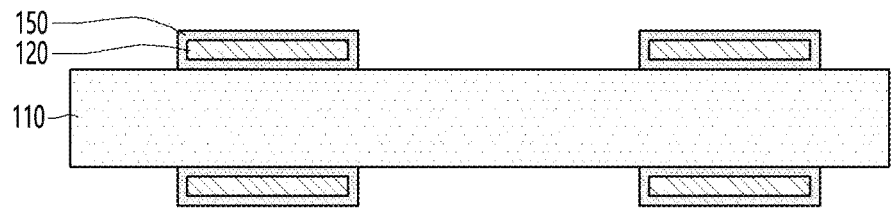

[FIG. 5]
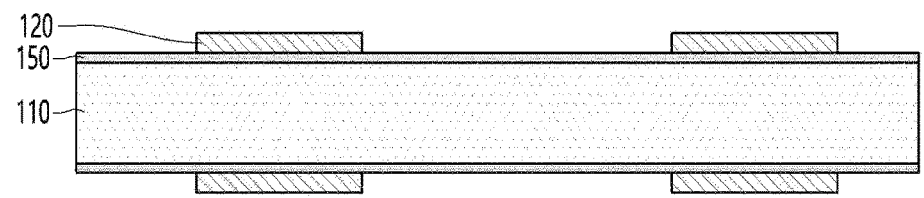
[FIG. 6]
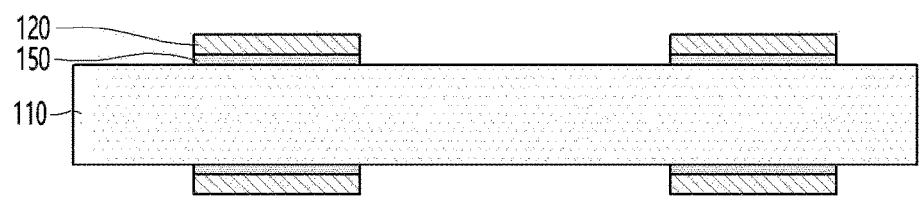
[FIG. 7]
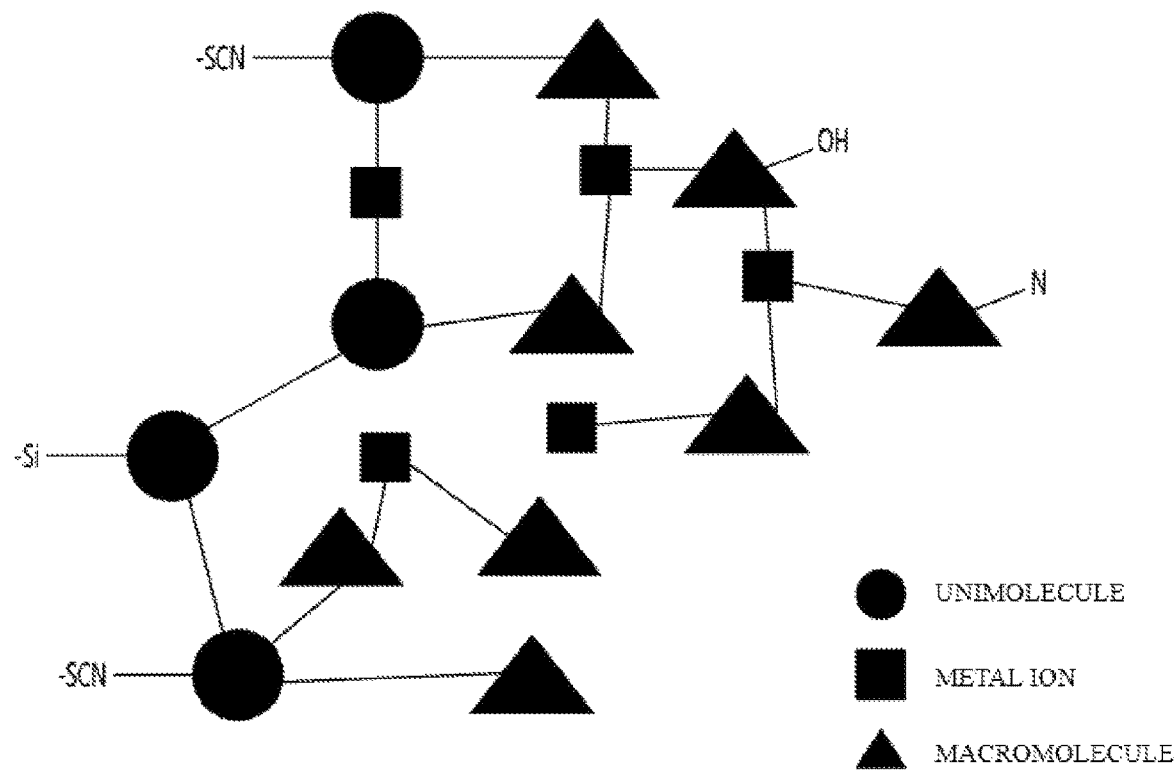

[FIG. 8]
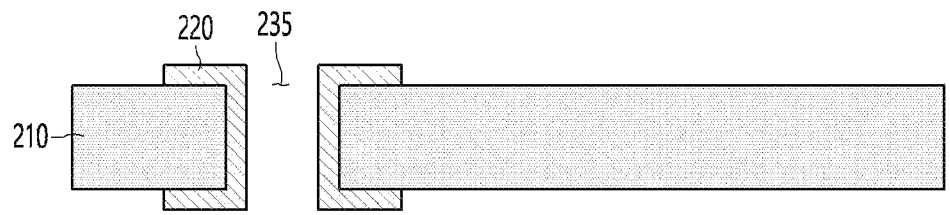
[FIG. 9]
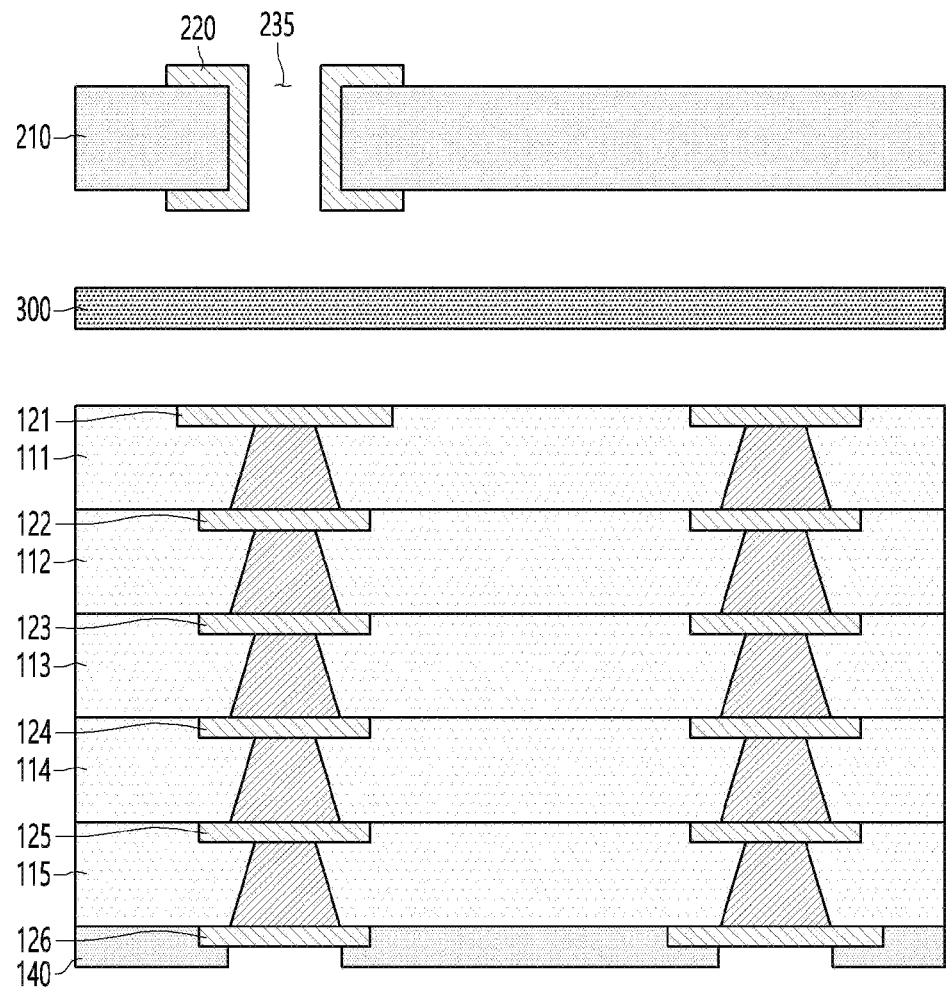

[FIG. 10]
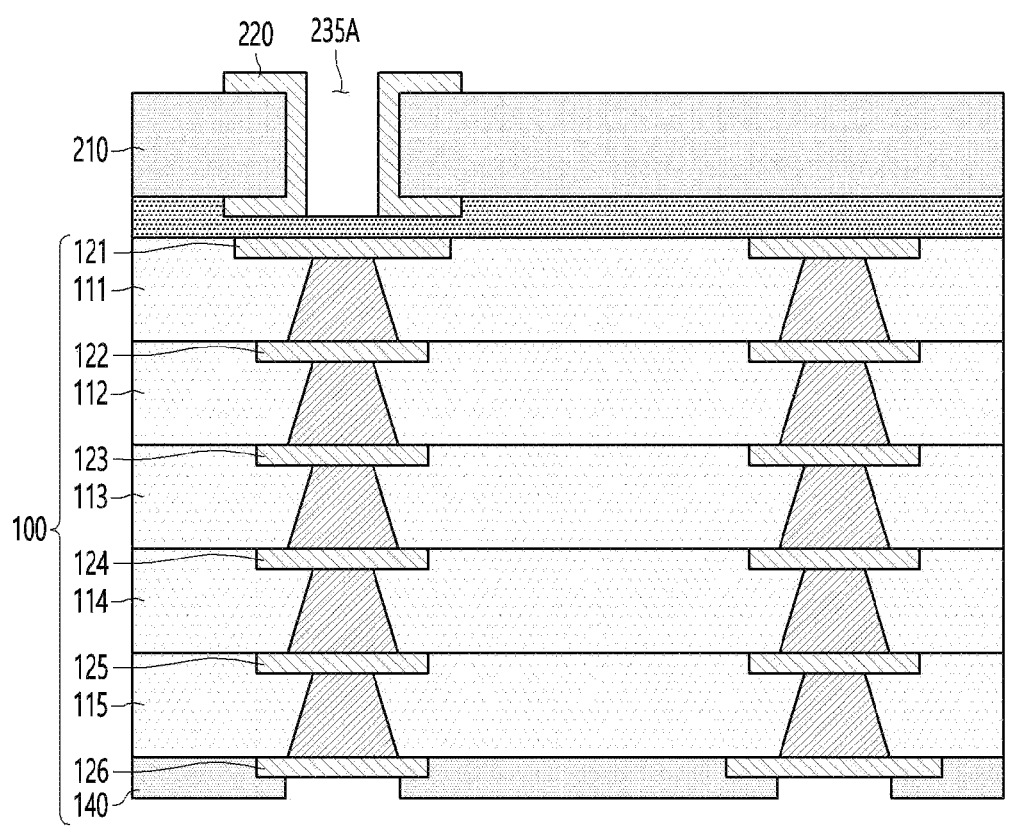

[FIG. 11]
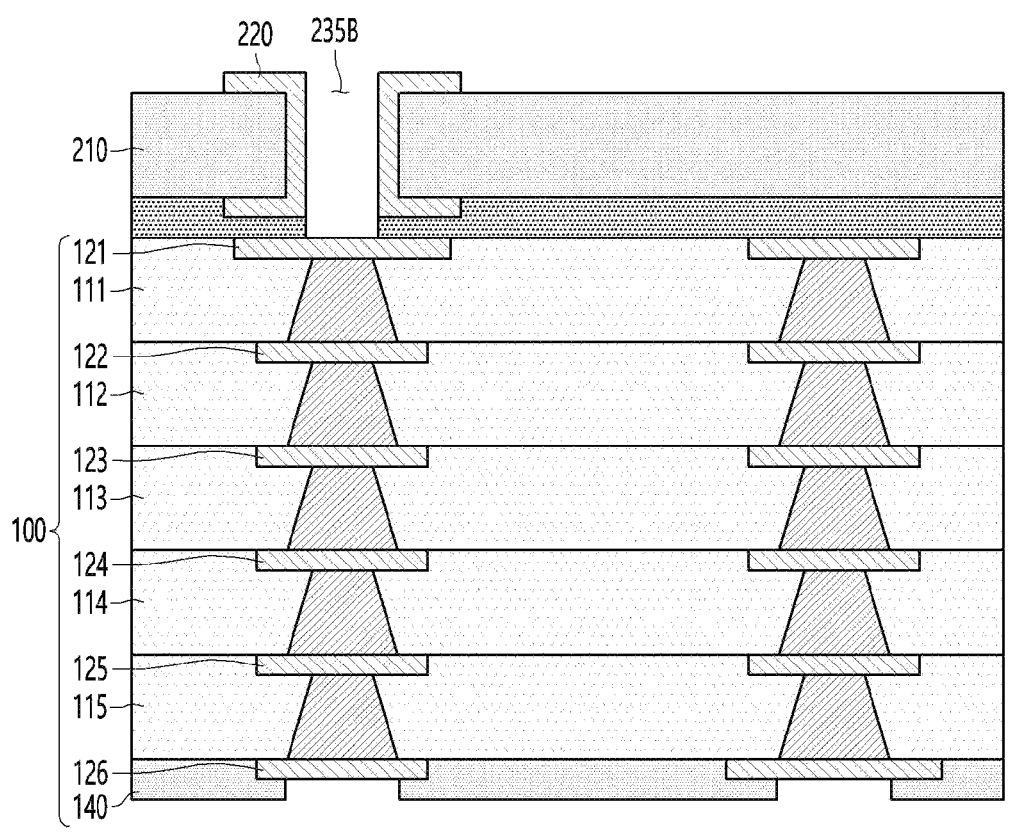

【FIG. 12】
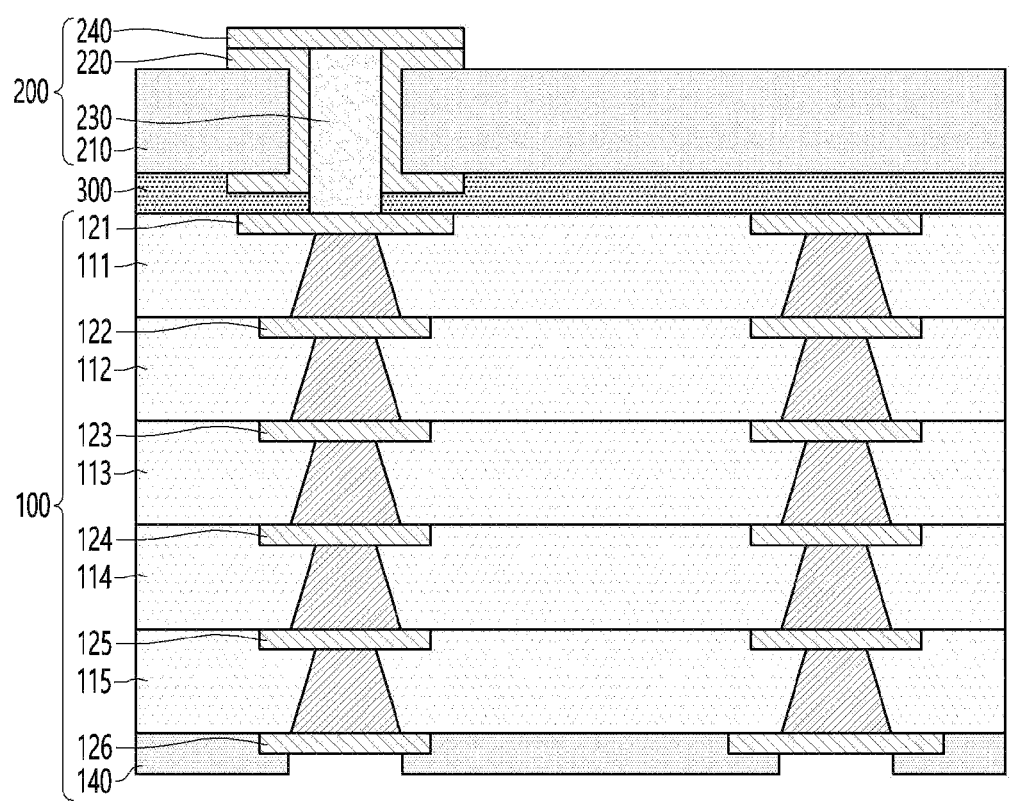

[FIG. 13]
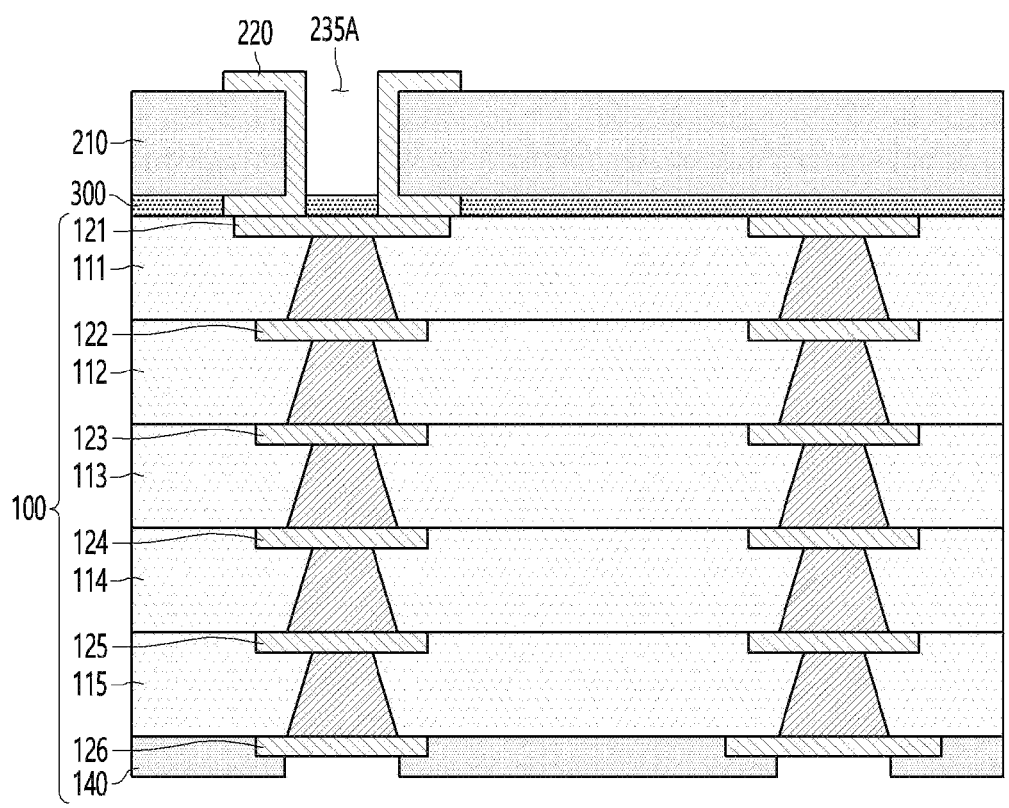

[FIG. 14]
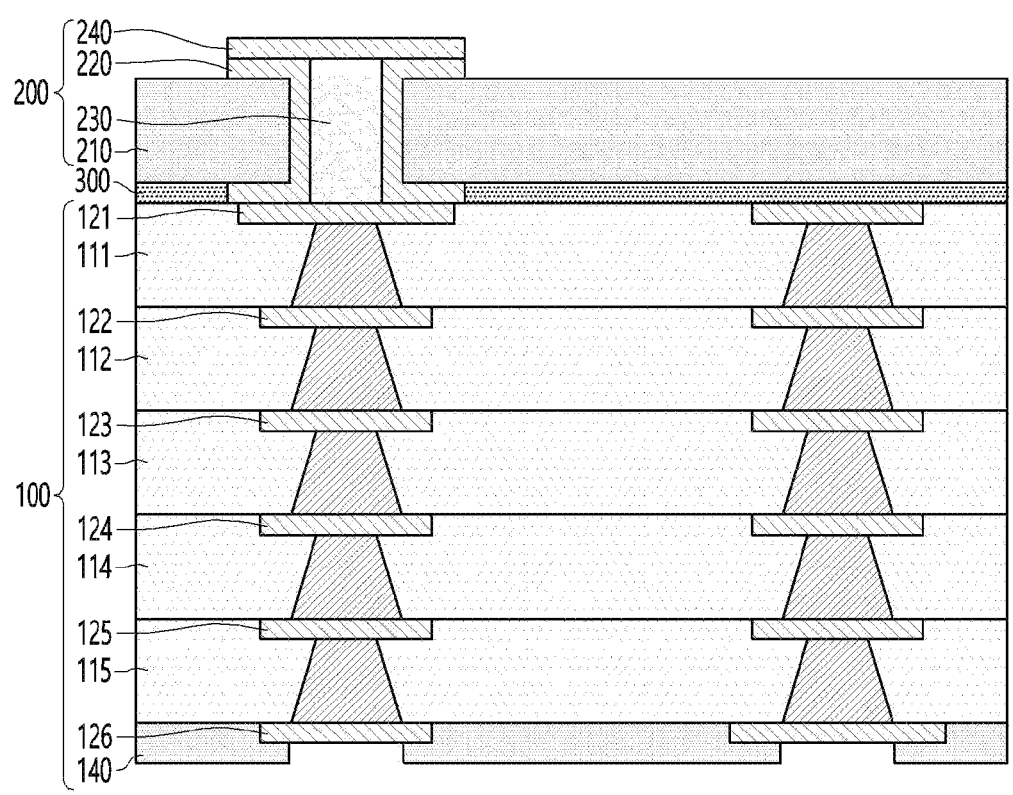

CIRCUIT BOARD

CROSS-REFERENCE TO RELATED PATENT APPLICATIONS

This application is a U.S. National Stage Application under 35 U.S.C. § 371 of PCT Application No. PCT/KR2021/000455, filed Jan. 13, 2021, which claims priority to Korean Patent Application No. 10-2020-0006073, filed Jan. 16, 2020, whose entire disclosures are hereby incorporated by reference.

TECHNICAL FIELD

An embodiment relates to a circuit board.

BACKGROUND ART

In general, a printed circuit board called PCB is a component in which wiring is integrated so that various devices are mounted or electrical connection between devices is possible.

The printed circuit board having various shapes and functions is being manufactured with the development of technology. Among these types of printed circuit board, a printed circuit board serving as a mediator between an element composed of an integrated circuit and a main printed circuit board is also being developed in order to mount an element composed of an integrated circuit applied to a small product on a main printed circuit board.

Therefore, according to the trend of multi-functionalization and slimming of applied products, the printed circuit board is also becoming slimmer in size while enabling the application of corresponding functions. As described above, according to the trend of high integration and slimming, fine patterning of the printed pattern of the printed circuit board, the via for connecting the circuit pattern between each layer of the printed circuit board, and the connecting terminal to which the device is connected is emerging as an important problem.

On the other hand, in recent high-speed integrated systems, circuit performance and data transmission speed are mainly limited by the state of the wiring (transmission path) of the printed circuit board. There is no need to satisfy the essential requirements for technological development to improve data processing speed and communication speed for conventional computers, mobile phone communication terminals, and other electronic devices.

Recently, as the processing speed of large-capacity data and communication speed for the above matters are required to be increased, a processing technology for wiring of a circuit board is required, and active research and development for this is being conducted. As one of these techniques, a technique for maximally lowering the transmission loss of high frequency may include a technique for controlling the surface roughness of the wiring.

In general, the material of the wiring may use copper or an alloy containing the same, the high resistivity of the surface roughness of the wiring shows poor characteristics as the frequency of the signal increases in the manufacturing process stage, and in this case, the signal loss is proportional to the frequency.

At this time, the conventional surface treatment technology in the circuit board shows a high transmission loss at 25 Gbps or more. Accordingly, in order to have a low transmission loss at 25 Gbps or higher, a low-roughness surface treatment technique for bonding between the copper foil constituting the wiring and the insulating layer is required.

However, the circuit board having a low-roughness surface treatment has a characteristic that the heat dissipation characteristic is remarkably deteriorated.

Therefore, in the embodiment, it is possible to provide a circuit board that can have a low transmission loss even at 25 Gbps while improving the heat dissipation characteristics of the circuit board.

DISCLOSURE

Technical Problem

The embodiment provides a circuit board in which a first substrate to which a low-roughness surface treatment technology is applied and a second substrate to which a hole plugging technology is applied are interconnected, and a method for manufacturing the same.

In addition, the embodiment provides a circuit board capable of improving heat dissipation characteristics while lowering transmission loss of the circuit board and a method of manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

A circuit board according to the embodiment includes a first substrate including a first insulating layer and a first pad disposed on an upper surface of the first insulating layer; a second substrate including a second insulating layer including a via hole and a metal layer formed on upper and lower surfaces of the second insulating layer and an inner wall of the via hole; a third insulating layer disposed between the first substrate and the second substrate and having a first opening in a region overlapping the via hole; a via filling the via hole and disposed on the first pad exposed through the opening of the third insulating layer; and a second pad disposed on the via and the metal layer disposed on an upper surface of the second insulating layer.

The third insulating layer may correspond to the adhesive insulating layer 300 described below, the first insulating layer may correspond to the insulating layer disposed on an uppermost portion of the plurality of insulating layers 111, 112, 113, 114, and 115 included in the first substrate 100 to be described below, and the second insulating layer may correspond to the insulating layer 210 included in the second substrate.

The third insulating layer is disposed between a lower surface of a metal layer disposed on the lower surface of the second insulating layer and an upper surface of the first pad, and a lower surface of the metal layer disposed on the lower surface of the second insulating layer is spaced apart from the upper surface of the first pad by the third insulating layer.

In addition, a lower surface of the via is positioned lower than the lower surface of the metal layer.

In addition, the via includes a first portion in contact with the metal layer, a second portion in contact with the third insulating layer, a third portion in contact with the first pad, and a fourth portion in contact with the second pad.

In addition, the third insulating layer includes a second opening formed between a lower surface of the metal layer disposed on the lower surface of the second insulating layer and an upper surface of the first pad, and wherein the lower surface of the metal layer disposed on the lower surface of the second insulating layer is in contact with the upper surface of the first pad through the second opening.

In addition, the via includes: a first portion in contact with the metal layer, a third portion in contact with the first pad, and a fourth portion in contact with the second pad, and wherein the via is in non-contact with the third insulating layer.

In addition, a surface roughness (Ra) of at least one of the first pad and the metal layer is 0.5 μm or less.

In addition, the circuit board includes a buffer layer disposed on the first pad and a surface of the metal layer, wherein the buffer layer includes carbon atoms, nitrogen atoms, oxygen atoms, silicon atoms, sulfur atoms, and metal atoms, a ratio of the carbon atoms to the metal atoms ((carbon atom/copper atom) 100) is 5 to 7, a ratio of the nitrogen atoms to the metal atoms ((nitrogen atom/copper atom)*100) is 1.5 to 7, a ratio of the oxygen atoms to the metal atoms ((oxygen atom/copper atom)*100) is 1.1 to 1.9, a ratio of the silicon atoms to the metal atoms ((silicon atom/copper atom)*100) is 0.5 to 0.9, and a ratio of the atoms sulfur to the metal atoms ((sulfur atom/copper atom) *100) is 0.5 to 1.5.

In addition, the carbon atoms, the nitrogen atoms, the oxygen atoms, the silicon atoms, and the sulfur atoms are bonded to each other and exist in a plurality of molecules, wherein the metal atoms exist as a metal ion, wherein the molecules and the metal ion are chemically bonded to each other, and wherein the molecules include a macromolecule and a unimolecule.

In addition, the metal atoms are formed by oxidizing the circuit pattern.

In addition, the buffer layer includes a plurality of terminal groups connected to the first or second insulating layer and the first pad or the metal layer, and wherein the terminal groups are covalent-bonded or coordinate-bonded to the first insulating layer and the first pad, or the second insulating layer and the metal layer.

In addition, the third insulating layer has a Dk of 3.4 or less and a Df of 0.004 or less.

On the other hand, the circuit board according to the embodiment includes a first substrate including a first insulating layer and a first pad disposed on an upper surface of the first insulating layer; a second substrate including a second insulating layer including a via hole and a metal layer formed on upper and lower surfaces of the second insulating layer and an inner wall of the via hole; a third insulating layer disposed between the first substrate and the second substrate and having a first opening in a region overlapping the via hole; a via filling the via hole and disposed on the first pad exposed through the opening of the third insulating layer; and a second pad disposed on the via and the metal layer disposed on an upper surface of the second insulating layer, wherein a buffer layer is formed on the first pad and the surfaces of the metal layer, wherein the buffer layer includes a first functional group bonded to the first insulating layer or the second insulating layer and a second functional group bonded to the first pad or the metal layer, and the first functional group and the second functional group include at least one of the carbon atoms, the nitrogen atoms, the oxygen atoms, the silicon atoms, and the sulfur atoms, wherein the third insulating layer includes a region having a lower surface in contact with a buffer layer disposed on an upper surface of the first pad, and an upper surface in contact with a buffer layer disposed under a lower surface of the metal layer.

In addition, the first functional group includes a hydroxyl group (—OH) and an N group of an azole group, and the second functional group includes a Si group and a thiocyanate group (—SCN) of a silane group, wherein the buffer layer further includes a macromolecule, a unimolecule, and a metal ion, and the metal ion is chemically bonded to the macromolecule and the unimolecule.

On the other hand, a manufacturing method of the circuit board according to the embodiment includes preparing a first insulating layer, manufacturing a first substrate by forming a first pad on an upper surface of the first insulating layer; forming a first buffer layer on an upper surface of the first pad; preparing a second insulating layer, forming a via hole in the second insulating layer; manufacturing a second substrate by forming a metal layer on upper and lower surfaces of the second insulating layer and an inner wall of the via hole, forming a second buffer layer on a lower surface of the metal layer positioned on a lower surface of the second insulating layer; bonding the first substrate and the second substrate in a state where a third insulating layer is positioned between the first substrate and the second substrate; removing the third insulating layer positioned on an upper surface of the first pad; forming a via filling the via hole on the first pad; and forming a second pad on an upper surface of the via and an upper surface of the metal layer positioned on the upper surface of the second insulating layer.

In addition, the third insulating layer is disposed between a lower surface of a metal layer disposed on the lower surface of the second insulating layer and an upper surface of the first pad, and a lower surface of the metal layer disposed on the lower surface of the second insulating layer is spaced apart from the upper surface of the first pad by the third insulating layer, and a lower surface of the via is positioned lower than the lower surface of the metal layer.

In addition, the via includes a first portion in contact with the metal layer, a second portion in contact with the third insulating layer, a third portion in contact with the first pad, and a fourth portion in contact with the second pad.

In addition, the third insulating layer includes a second opening formed between a lower surface of the metal layer disposed on the lower surface of the second insulating layer and an upper surface of the first pad, and wherein the lower surface of the metal layer disposed on the lower surface of the second insulating layer is in contact with the upper surface of the first pad through the second opening.

In addition, the via includes: a first portion in contact with the metal layer, a third portion in contact with the first pad, and a fourth portion in contact with the second pad, and wherein the via is in non-contact with the third insulating layer.

Advantageous Effects

In this embodiment, the first substrate to which the low-roughness surface treatment technology is applied and the second substrate to which the hole plugging technology is applied are respectively manufactured. Then, an adhesive insulating layer is disposed between the first and second substrates manufactured as described above to bond the first and second substrates. Thereafter, the first pad included in the first substrate is exposed by processing an inside of the via hole of the second substrate while the first substrate and the second substrate are bonded to each other. Then, when the first pad is exposed, a via layer filling the inside of the via hole is formed on the first pad, and a second pad is formed on the via layer. According to this embodiment, signal loss occurring in the high frequency band can be minimized by using the first substrate to which the low-roughness surface treatment technology is applied. In addition, according to this embodiment, heat generated from the first substrate can be efficiently discharged to the outside by combining the second substrate and the first substrate to which the hole plugging technology is applied, and accordingly, the heat dissipation characteristics of the circuit board may be improved. In conclusion, according to the present embodiment, it is possible to provide a circuit board for a 5G antenna module that can be used in a high-frequency band of the circuit board and has very high heat dissipation characteristics.

DESCRIPTION OF DRAWINGS

FIG. 1 is a view showing a circuit board according to a first embodiment.

FIG. 2 is a view showing the first substrate shown in FIG. 1.

FIGS. 3 to 6 are views for explaining the structure of the buffer layer in the first substrate shown in FIG. 2.

FIG. 7 is a view illustrating a simple structural formula of an insulating layer of the first substrate according to the embodiment.

FIG. 8 is a view showing the second substrate shown in FIG. 1.

FIGS. 9 to 12 are views for explaining a manufacturing process of the circuit board shown in FIG. 1.

FIGS. 13 and 14 are views for explaining a method of manufacturing a circuit board according to a second embodiment.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

FIG. 1 is a view showing a circuit board according to a first embodiment.

Referring to FIG. 1, the circuit board includes a first substrate 100, a second substrate 200, and an adhesive insulating layer 300 disposed between the first substrate 100 and the second substrate 200.

The first substrate 100 may be a substrate for a 5G antenna to which a low-roughness surface treatment technology is applied. In addition, the second substrate 200 may be a substrate including a via portion 220, 230, and 240 to which hole plugging technology is applied.

In addition, the first substrate 100 and the second substrate 200 may be individually manufactured, and they may be bonded to each other through the adhesive insulating layer 300 after being individually manufactured.

In this case, a portion of the via portion included in the second substrate 200 is formed when the second substrate 200 is manufactured, and the remaining portion may be formed after the first substrate 100 and the second substrate 200 are bonded to each other. Accordingly, a portion of the via portion may be in direct contact with the adhesive insulating layer 300, and a remaining portion of the via portion may be disposed in direct contact with the first substrate 100.

Hereinafter, the first substrate 100, the second substrate 200, and the adhesive insulating layer 300 will be described in detail.

FIG. 2 is a view showing the first substrate shown in FIG. 1, FIGS. 3 to 6 are views for explaining the structure of the buffer layer in the first substrate shown in FIG. 2, and FIG. 7 is a view illustrating a simple structural formula of an insulating layer of the first substrate according to the embodiment.

Referring to FIGS. 2 to 7, the first substrate 100 may be a substrate to which a low-roughness surface treatment that can be applied to a 5G antenna and can transmit signals without loss even in a high-frequency band is applied.

The first substrate 100 for this purpose may include insulating layers 111, 112, 113, 114, 115, circuit patterns 121, 122, 123, 124, 125, 126, via 130, and a protective layer 140.

The insulating layers 111, 112, 113, 114, and 115 may have a flat plate structure. The insulating layers 111, 112, 113, 114, and 115 may be a printed circuit board (PCB). Here, the insulating layers 111, 112, 113, 114, and 115 may be implemented as a single substrate, or alternatively, may be implemented as a multilayer substrate in which a plurality of insulating layers are sequentially stacked.

Accordingly, the insulating layers 111, 112, 113, 114, and 115 may be configured in plurality.

For example, the insulating layers 111, 112, 113, 114, and 115 may include a first insulating layer 110, a second insulating layer 112, a third insulating layer 113, and a fourth insulating layer 114 and a fifth insulating layer 115 from the insulating layer disposed on an uppermost portion. In addition, circuit patterns 121, 122, 123, 124, 125, and 126 may be disposed on the surfaces of the first to fifth insulating layers, respectively. That is, circuit patterns 121, 122, 123, 124, 125, and 126 may be disposed on at least one of both surfaces of the first to fifth insulating layers. At this time, the circuit patterns 121, 122, 123, 124, 125, and 126 may include a via pad connected to a via, a connection pad connected to an external board, a mounting pad connected to an electronic component, and a trace that is a signal transmission line between the pads.

The plurality of insulating layers 111, 112, 113, 114, 115 is a substrate on which an electric circuit capable of changing wiring is formed, and may include all of a printed circuit board, a wiring board, and an insulating substrate made of an insulating material capable of forming circuit patterns on the surface.

At least one of a plurality of insulating layers 111, 112, 113, 114, and 115 may include a prepreg including glass fiber. In detail, at least one of a plurality of insulating layers 111, 112, 113, 114, and 115 may include an epoxy resin and a material in which glass fibers and a silicon-based filler are dispersed in the epoxy resin.

In addition, at least one of the insulating layers 111, 112, 113, 114, and 115 may be rigid or may be flexible. For example, at least one of the insulating layers 111, 112, 113, 114, and 115 may include glass or plastic. In detail, at least one of the insulating layers 111, 112, 113, 114, and 115 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least one of the insulating layers 111, 112, 113, 114, and 115 may include an optical isotropic film. For example, at least one of the insulating layers 111, 112, 113, 114, and 115 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least one of the insulating layers 111, 112, 113, 114, and 115 may be bent while having a partially curved surface. That is, at least one of the insulating layers 111, 112, 113, 114, and 115 may be bent while having a partially flat surface and a partially curved surface. In detail, at least one of the insulating layers 111, 112, 113, 114, and 115 may have a curved end while having a curved surface, or may have a surface including a random curvature and may be bent or curved.

In addition, at least one of the insulating layers 111, 112, 113, 114, and 115 may be a flexible substrate having a flexible characteristic.

Also, at least one of the insulating layers 111, 112, 113, 114, and 115 may be a curved or bended substrate. In this case, the insulating layers 111, 112, 113, 114, and 115 represent electrical wiring connecting circuit components based on the circuit design as a wiring diagram, and electrical conductors can be reproduced on the insulating material. In addition, it is possible to mount electrical components and form wiring connecting them in a circuit, and mechanically fix components other than the electrical connection function of the components.

Circuit patterns 121, 122, 123, 124, 125, and 126 are respectively disposed on the surfaces of the insulating layers 111, 112, 113, 114, and 115. The circuit patterns 121, 122, 123, 124, 125, and 126 are wirings that transmit electrical signals, and may be formed of a metal material having high electrical conductivity. To this end, the circuit patterns 121, 122, 123, 124, 125, and 126 may be formed of at least one metal material selected from gold (Au), silver (Ag), platinum (Pt), titanium (Ti), tin (Sn), copper (Cu), and zinc (Zn). In this case, the circuit patterns 121, 122, 123, 124, 125, and 126 have been described as wiring for electric signal transmission. However, this may include a pattern for transferring heat for a heat dissipation function in addition to this.

In addition, the circuit patterns 121, 122, 123, 124, 125, and 126 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the circuit patterns 121, 122, 123, 124, 125, and 126 may be formed of copper (Cu) having high electrical conductivity and a relatively inexpensive price.

The circuit patterns 121, 122, 123, 124, 125, and 126 may be formed by an additive process, a subtractive process, a modified semi additive process (MSAP), and a semi additive process (SAP) process, which are typical circuit board manufacturing processes. and a detailed description thereof will be omitted here.

Meanwhile, a buffer layer may be disposed on a surface of the insulating layers 111, 112, 113, 114, 115 and/or the circuit patterns 121, 122, 123, 124, 125, and 126.

In detail, the buffer layer 150 may be disposed on the surface of at least one of the upper surface, lower surface, and side surfaces of the circuit patterns 121, 122, 123, 124, 125 and 126 or on the surface of the insulating layer 111, 112, 113, 114 and 115 on which the circuit pattern is disposed.

A buffer layer formed on the insulating layer or the circuit pattern will be described in detail below.

At least one via 130 is formed in the insulating layers 111, 112, 113, 114, and 115. The via 130 is disposed to pass through at least one insulating layer among the plurality of insulating layers 111, 112, 113, 114, and 115. The via 130 may pass through only one insulating layer among the plurality of insulating layers 111, 112, 113, 114, and 115, and differently from the plurality of insulating layers 111, 112, 113, 114 and 115 may be formed while passing through at least two insulating layers in common. Accordingly, the via 130 electrically connects the circuit patterns disposed on the surfaces of different insulating layers to each other.

The via 130 may be formed by filling an inside of a through hole (not shown) penetrating at least one of a plurality of insulating layers 111, 112, 113, 114 and 115 with a conductive material.

The through hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, at least one of plurality of insulating layers 111, 112, 113, 114 and 115 may be opened by using a chemical containing aminosilane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the via portion 130 may be formed by filling the inside of the through hole with a conductive material. The metal material forming the via portion 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

A first pad 121 may be disposed on an uppermost first insulating layer of the plurality of insulating layers 111, 112, 113, 114, and 115. In this case, the first pad 121 may be a connection pad connected to the second substrate 200. Preferably, the first pad 121 may be a via pad directly connected to a via formed on the second substrate 200. This will be described in more detail below.

In addition, a bonding pad 126 may be disposed under the lowermost insulating layer to which an additional external substrate (not shown) is to be attached among the plurality of insulating layers 111, 112, 113, 114, and 115. In this case, the bonding pad 126 may be a circuit pattern whose surface is exposed through an opening in a protective layer, which will be described later, among circuit patterns disposed on the lower surface of the lowermost insulating layer.

A portion of the bonding pad 126 may serve as a pattern for signal transmission, and a remaining portion of the bonding pad 126 may serve as an outer lead on which an adhesive member (not shown) is disposed for attachment of the external substrate. In other words, the bonding pad 126 may include a soldering pad for a soldering application.

A surface treatment layer (not shown) may be disposed on the surface of the bonding pad 126.

The surface treatment layer increases the wire bonding or soldering properties while protecting the bonding pad 126. To this end, the surface treatment layer is formed of a metal including gold (Au). Preferably, the surface treatment layer may include only pure gold (purity of 99% or more), and alternatively, may be formed of an alloy containing gold (Au). When the surface treatment layer is formed of an alloy containing gold, the alloy may be formed of a gold alloy containing cobalt.

Meanwhile, the protective layer 140 is disposed under the lowermost insulating layer among the plurality of insulating layers. The protective layer 140 has an opening exposing the surface of the bonding pad 126. The protective layer 140 may include a solder resist.

As described above, a buffer layer may be disposed on at least one surface of the insulating layer 110 including the plurality of insulating layers 111, 112, 113, 114, and 115 or the circuit pattern 120 including the plurality of circuit patterns 121, 122, 123, 124, 125, 126.

In detail, the buffer layer 150 may be disposed between the insulating layer 110 and the circuit pattern 120 in a region where the insulating layer 110 and the circuit pattern 120 overlap.

The buffer layer 150 may be a surface treatment layer treated on the surface of the insulating layer 110. The buffer layer 150 may be a surface treatment layer to be treated on the surface of the circuit pattern 120.

The buffer layer 150 may be an intermediate layer disposed between the insulating layer and the circuit pattern. The buffer layer 150 may be a functional layer that improves adhesion between the insulating layer and the circuit pattern, that is, an adhesion strengthening layer.

FIGS. 3 to 6 are views for describing a position and arrangement relationship of the buffer layer 150.

Referring to FIG. 3, the buffer layer 150 may be disposed on the surface of the circuit pattern. For example, the buffer layer 150 may be disposed on an upper surface and a lower surface of the circuit pattern. That is, the buffer layer 150 may be disposed on a surface that is in contact with or faces the insulating layer 110 among the surfaces of the circuit pattern.

Alternatively, referring to FIG. 4, the buffer layer 150 may be disposed on the surface of the circuit pattern. For example, the buffer layer 150 may be disposed on the upper surface, the lower surface, and both side surfaces of the circuit pattern. That is, the buffer layer 150 may be disposed to surround the entire surface of the circuit pattern.

Alternatively, referring to FIG. 5, the buffer layer 150 may be disposed on the surface of the insulating layer 110. For example, the buffer layer 150 may be disposed on an upper surface and a lower surface of the insulating layer 110. That is, the buffer layer 150 may be disposed on a surface that is in contact with or faces the circuit pattern 120 among surfaces of the insulating layer 110. That is, the buffer layer 150 may be disposed on the entire surface of the insulating layer 110 on which the circuit pattern 120 is disposed.

Alternatively, referring to FIG. 6, the buffer layer 150 may be disposed on the surface of the insulating layer 110. For example, the buffer layer 150 may be disposed on the upper surface and the lower surface of the insulating layer 110. That is, the buffer layer 150 may be disposed on a surface that is in contact with or faces the circuit pattern 120 among the surfaces of the insulating layer 110. That is, the buffer layer 150 may be disposed only in a region where the circuit pattern 120 is disposed on the surface of the insulating layer 110 in which the circuit pattern 120 is disposed.

That is, the buffer layer 150 may be disposed between the insulating layer 110 and the circuit pattern 120. In detail, the buffer layer 150 may be disposed between the insulating layer 110 and the circuit pattern 120, and the buffer layer 150 may be bonded one surface of the insulating layer 110 and one surface of the circuit pattern 120. That is, an end group of the buffer layer, an end group of the insulating layer, an end group of the buffer layer, and an end group of the circuit pattern may be chemically bonded.

The buffer layer 150 may be formed to have a constant thickness. In detail, the buffer layer 150 may be formed as a thin film. In detail, the buffer layer 150 may be formed to have a thickness of 500 nm or less. In more detail, the buffer layer 150 may be formed to have a thickness of 5 nm to 500 nm.

When the thickness of the buffer layer 150 is formed to be 5 nm or less, the thickness of the buffer layer is too thin to sufficiently secure adhesion between the insulating layer and the circuit pattern, and when the thickness of the buffer layer is formed to exceed 500 nm, an effect of improving adhesion according to the thickness is insignificant, the overall thickness of the circuit board may be increased, and a dielectric constant of the insulating layer is increased, so that the transmission loss of the circuit board may be increased in high-frequency applications.

The buffer layer 150 may include a plurality of atoms. The plurality of atoms included in the buffer layer 150 are bonded to each other in the buffer layer to be included in a molecular or ionic form, and the molecules, the molecule, and the ion may be chemically bonded to each other to form a buffer layer.

The buffer layer 150 may include at least one of carbon atoms, nitrogen atoms, oxygen atoms, silicon atoms, sulfur atoms, and metal atoms. In detail, the buffer layer 150 may include all of the carbon atoms, the nitrogen atoms, the oxygen atoms, the silicon atoms, the sulfur atoms, and the metal atoms.

The carbon atoms, the nitrogen atoms, the oxygen atoms, the silicon atoms, the sulfur atoms, and the metal atoms may exist in a molecular form by bonding to each other in the buffer layer, or may exist in an ionic form alone.

The oxygen atoms, the carbon atoms, and the nitrogen atoms among the plurality of atoms may be related to a functional group of the buffer layer bonded to the insulating layer. That is, a functional group formed by molecules including the oxygen atoms, the carbon atoms, the nitrogen atoms, and the like may be chemically bonded to the insulating layer.

In addition, the carbon atoms, the nitrogen atoms, the silicon atoms, and the sulfur atoms among the plurality of atoms may be related to a functional group of the buffer layer bonded to the circuit pattern. That is, the functional group formed by molecules including the carbon atoms, the nitrogen atoms, the silicon atoms, the sulfur atoms, and the like may be chemically bonded to the circuit pattern.

In addition, the metal atoms may bond molecules formed by the carbon atoms, the nitrogen atoms, the oxygen atoms, the silicon atoms, and the sulfur atoms to each other. That is, the molecules formed by the carbon atoms, nitrogen atoms, oxygen atoms, silicon atoms, and sulfur atoms may be chemically bonded through the metal atoms to form a buffer layer. That is, the metal atoms may be disposed between the molecules to serve as a medium for chemically bonding the molecules.

To this end, the carbon atoms, the nitrogen atoms, the oxygen atoms, the silicon atoms, the sulfur atoms, and the metal atoms may be included in a constant mass ratio. In detail, the metal atoms among the plurality of atoms may be included in the largest amount than other atoms, and the carbon atoms, nitrogen atoms, oxygen atoms, silicon atoms, and sulfur atoms may be included in a constant mass ratio based on the metal atoms.

In detail, a ratio of the carbon atoms to the metal atoms ((carbon atom/copper atom)*100) may be 5 to 7.

In addition, a ratio ((nitrogen atom/copper atom)*100) of the nitrogen atoms to the metal atoms may be 1.5 to 7.

In addition, a ratio of the oxygen atoms to the metal atoms ((oxygen atom/copper atom)*100) may be 1.1 to 1.9.

In addition, a ratio of the silicon atoms to the metal atoms ((silicon atom/copper atom)*100) may be 0.5 to 0.9.

In addition, a ratio of the atoms sulfur to the metal atoms ((atoms sulfur/atoms copper)*100) may be 0.5 to 1.5.

The ratio of the carbon atoms, the nitrogen atoms, the oxygen atoms, the silicon atoms, and the sulfur atoms to the metal atoms may be related to a bonding force of the insulating layer or the circuit board.

In detail, when the ratio of the carbon atoms to the metal atoms ((carbon atom/copper atom)*100) is out of the range of 5 to 7, the bonding force between the buffer layer and the circuit board or the buffer layer and the insulating layer may be weakened.

In addition, when the ratio ((nitrogen atom/copper atom) *100) of the nitrogen atoms to the metal atoms is out of the range of 1.5 to 7, the bonding force between the buffer layer and the circuit board or the buffer layer and the insulating layer may be weakened.

In addition, when the ratio of the oxygen atoms to the metal atoms ((oxygen atom/copper atom)*100) is out of the range of 1.1 to 1.9, the bonding force between the buffer layer and the insulating layer may be weakened.

In addition, when the mass ratio of the silicon atoms to the metal atoms ((silicon atom/copper atom)*100) is out of the range of 0.5 to 0.9, the bonding force between the buffer layer and the circuit board may be weakened.

In addition, when the ratio of the atoms sulfur to the metal atoms ((sulfur atoms/copper atom)*100) is out of the range of 0.5 to 1.5, the bonding force between the buffer layer and the circuit board may be weakened.

Meanwhile, the carbon atoms, the nitrogen atoms, the oxygen atoms, the silicon atoms, the sulfur atoms, and the metal atoms exist in the buffer layer in a form of molecules or ions, and the molecules and the ions may be bonded and connected to each other.

In detail, the buffer layer 150 may include molecules and metal ions formed by the carbon atoms, the nitrogen atoms, the oxygen atoms, the silicon atoms, the sulfur atoms, and the metal atoms. The molecules included in the buffer layer 150 may include at least two types of molecules depending on a size of the molecule or a size of molecular weight. In detail, the molecules may include a macromolecule and a unimolecule.

The macromolecule, the unimolecule, and the metal ion may be bonded in the buffer layer to form a structure that is connected to each other.

In detail, the macromolecule, the unimolecule, and the metal ion may be chemically bonded in the buffer layer by covalent and coordination bonds to form a structure that is connected to each other.

The metal ion may connect the macromolecules, the unimolecules, or the macromolecule and the unimolecule to each other. In detail, the macromolecules, the unimolecules, or the macromolecule and the unimolecule are coordinate-bonded to the metal ion, and accordingly, the macromolecules, the unimolecules, or the macromolecule and the unimolecule may be chemically bounded.

The metal ion may include the same material as the circuit pattern. Alternatively, the metal ion may include a material different from that of the circuit pattern. For example, when the circuit pattern includes copper, the metal ion may include copper or a metal other than copper.

In detail, the metal ion may be formed by the circuit pattern. In detail, the metal ion may be formed by ionizing the circuit pattern including the metal using a separate oxidizing agent. Accordingly, the ionized metal ion may be coordinate-bonded to the macromolecule and the unimolecule in the buffer layer to connect the molecules to each other to form the buffer layer.

Alternatively, a separate metal ion is added at the time of forming the buffer layer, and the metal ion may be coordinate-bonded to the macromolecule and the unimolecule in the buffer layer to connect the molecules to each other to form the buffer layer. At this time, the metal ion added separately may be the same as or different from the metal of the circuit pattern.

The macromolecule and the unimolecule may include at least one of the carbon atoms, the nitrogen atoms, the oxygen atoms, the silicon atoms, and the sulfur atoms.

That is, the macromolecule and the unimolecule may be a molecule including at least one of the carbon atoms, the nitrogen atoms, the oxygen atoms, the silicon atoms, and the sulfur atoms.

In detail, the macromolecule may include a molecule including the carbon atoms and the nitrogen atoms. In detail, the macromolecule may include an azole group including the carbon atoms and the nitrogen atoms.

In addition, the macromolecule may include a molecule including the silicon atoms. In detail, the macromolecule may include a silane group including the silicon atoms.

In addition, the unimolecule may include the carbon atoms, the nitrogen atoms, and the sulfur atoms. That is, the unimolecule may be a molecule including the carbon atoms, the nitrogen atoms, and the sulfur atoms. For example, the unimolecule may include an SCN group to which a thiocyanate group (—SCN) is connected.

Referring to FIG. 7, the buffer layer 150 may include a plurality of functional groups. In detail, the buffer layer 150 may include a first functional group chemically bonded to the insulating layer 110 and a second functional group chemically bonded to the circuit pattern 120.

That is, the macromolecule and the unimolecules may include a plurality of terminal groups, that is, functional groups, chemically bonded to the insulating layer and the circuit pattern. By such functional groups, the insulating layer and the circuit pattern are chemically tightly bonded by the buffer layer, so that the adhesion between the insulating layer and the circuit pattern may be improved.

The first functional group and the second functional group may be defined as terminal groups of the buffer layer connected to one of the macromolecule, the mono atoms, and the metal atoms.

The first functional group may be bonded to the insulating layer 110 by the covalent bond. The first functional group may include functional groups covalent-bonded to the insulating layer 110. In detail, the first functional group may include a hydroxyl group (—OH) and an N group of the azole group.

In addition, the second functional group may be bonded to the circuit pattern 120 by the coordination bond. The second functional group may include functional groups coordinate-bonded to the circuit pattern 120. In detail, the second functional group may include a Si group and the thiocyanate group (—SCN) of the silane group.

The first functional group and the second functional group included in the buffer layer may be chemically bonded to the insulating layer and the circuit pattern, respectively. Accordingly, the adhesion between the insulating layer, which is a dissimilar material, and the circuit pattern may be improved by the buffer layer disposed between the insulating layer and the circuit pattern.

Hereinafter, the present invention will be described in more detail by measuring dielectric constant according to Examples and Comparative Examples. Such Examples are merely presented as examples to describe the present invention in more detail. Therefore, the present invention is not limited to the Examples.

Example

A copper layer was formed on an insulating layer containing prepreg (PPG). At this time, a coating layer including carbon atoms, nitrogen atoms, oxygen atoms, silicon atoms, sulfur atoms and metal atoms was coated on a surface in contact with the insulating layer among surfaces of the circuit layer, and then the copper layer and the insulating layer were adhered.

Subsequently, the copper layer was patterned to form a circuit pattern, and a circuit board was manufactured.

At this time, the buffer layer included a first functional group including an N group of a hydroxy group (—OH) and an azole group and a second functional group including a Si group of a silane group and a thiocyanate group (—SCN).

Subsequently, evaluation of adhesion and reliability according to a magnitude of roughness of the circuit pattern was performed.

Comparative Example

After forming the circuit pattern in the same manner as in Example except that a copper layer was formed by directly adhering the copper layer on the insulating layer without forming the coating layer on the copper layer and a circuit pattern was formed by patterning the copper layer, evaluation of the adhesion and reliability according to the magnitude of roughness of the circuit pattern was performed.

Adhesion/Reliability Measurement Method

In the evaluation of the adhesion of the circuit patterns according to Example and Comparative Example, a UTM 90° Peel value was measured using UTM equipment.

In addition, reliability evaluation was evaluated by NG when the peel strength (kgf/cm) of the circuit pattern was less than 0.6.

TABLE 1

| Circuit pattern roughness (Ra, um) | Example (peel strength, kgf/cm) | Comparative Example (peel strength, kgf/cm) |
| --- | --- | --- |
| 0.1 | 0.65 | 0.37 |
| 0.2 | 0.72 | 0.41 |
| 0.3 | 0.73 | 0.45 |
| 0.4 | 0.74 | 0.52 |
| 0.5 | 0.78 | 0.60 |
| 0.6 | 0.81 | 0.67 |

TABLE 2

| Circuit pattern roughness (Ra, um) | Example (reliability, whether or not peeling) | Comparative Example (reliability, whether or not peeling) |
| --- | --- | --- |
| 0.1 | OG | NG |
| 0.2 | OG | NG |
| 0.3 | OG | NG |
| 0.4 | OG | NG |
| 0.5 | OG | NG |
| 0.6 | OG | OG |

Referring to Table 1 and Table 2, it can be seen that the circuit board according to Example has improved reliability compared to the circuit board according to Comparative Example.

In detail, the circuit board according to Example forms a circuit pattern coated with a coating layer on an insulating layer. Accordingly, it can be seen that as the coating layer tightly chemically bonds to the insulating layer and the circuit pattern, a peel strength of the circuit pattern is increased, thereby improving the adhesion of the circuit pattern and the reliability of the circuit board.

That is, it can be seen that the circuit board according to Example may have adhesion capable of securing the reliability of the circuit board even when the roughness of the circuit pattern is reduced. In detail, it can be seen that the circuit board according to Example may have the adhesion capable of securing the reliability of the circuit board even when the surface roughness of the circuit pattern is 0.5 or less or in a range of 0.1 to 0.5.

That is, when the circuit board according to Example is applied to high-frequency applications, it is possible to reduce the transmission loss due to a skin effect by reducing the roughness of the circuit pattern, and even when the surface roughness is low, it is possible to secure the reliability of the circuit pattern by improving the adhesion of the circuit pattern by the coating layer.

On the other hand, in the case of the circuit board according to Comparative Example, the circuit pattern is directly formed on the insulating layer. Therefore, it can be seen that as the insulating layer and the circuit pattern are formed of different materials, the adhesion of the circuit pattern, that is, the peel strength, is very low.

That is, it can be seen that the reliability of the circuit board according to Comparative Example may not be secured unless the surface roughness of the circuit pattern is increased, and when the surface roughness of the circuit pattern is low, the reliability of the circuit board is deteriorated.

Therefore, when the circuit board according to Comparative Example is applied to high-frequency applications, it can be seen that the transmission loss due to the skin effect is increased by the surface roughness of the circuit pattern.

The circuit board according to the embodiment may include the buffer layer disposed between the insulating layer and the circuit pattern.

That is, in the circuit board according to Example, the buffer layer may be formed on the surface of the circuit pattern or the buffer layer may be formed on the insulating layer.

The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that the adhesion is reduced.

Therefore, by disposing the buffer layer chemically bonded to the insulating layer and the circuit pattern respectively between the insulating layer and the circuit pattern, the adhesion between the insulating layer and the circuit pattern may be improved.

That is, the buffer layer includes the plurality of functional groups bonded to the insulating layer and the circuit pattern, and the functional groups are chemically bonded to the insulating layer and the circuit pattern by the covalent bond or the coordination bond, thereby forming improving the adhesion between the insulating layer and the circuit pattern.

Accordingly, even when the surface roughness of the insulating layer is reduced, it is possible to secure adhesion reliability between the insulating layer and the circuit pattern.

Therefore, even when the circuit board according to the embodiment is used for high-frequency applications, it is possible to reduce the transmission loss of high-frequency signals by keeping the surface roughness of the circuit pattern low, and even when the surface roughness of the circuit pattern is kept low, since the adhesion between the insulating layer and the circuit pattern may be secured by the buffer layer, the overall reliability of the circuit pattern may be secured.

FIG. 8 is a view showing the second substrate shown in FIG. 1.

Referring to FIG. 8, the second substrate 200 includes an insulating layer 210, a via hole 235 formed through the insulating layer 210, a metal layer 220 formed on a surface of the insulating layer 210 and an inner wall of the via hole 235.

Meanwhile, although not shown in the drawing, a seed layer (not shown) may be additionally disposed between the surface of the insulating layer 210 and the metal layer 220.

In the second substrate 200, via holes 235 are formed in the insulating layers 111, 112, 113, 114, and 115 made of glass epoxy, and accordingly, the metal layer 220 for connecting the upper and lower surfaces of the insulating layer 210 connected to the via hole 235 and an inner wall of the via hole may be disposed.

The metal layer 220 is a configuration of a via portion according to an embodiment. Preferably, the via portion includes a first pad 121, a second pad 240, a via 230, and a metal layer 220.

In this case, the first pad 121 is a circuit pattern included in the first substrate 100.

In addition, the second pad 240, the via 230, and the metal layer 220 are configured to be formed in the second substrate 200.

In the first embodiment, the metal layer 220 has a structure that does not directly contact the first substrate 100.

That is, in the first embodiment, the adhesive insulating layer 300 is disposed between the first substrate 100 and the second substrate 200. Here, the adhesive insulating layer 300 may also be disposed between the metal layer 220 and the first pad 121. In this case, the buffer layer 150 as described above may also be disposed on the upper surface of the first pad 121 in the embodiment. Accordingly, bonding strength between the adhesive insulating layer 300 and the first substrate 100 may be improved by the buffer layer 150.

Meanwhile, one surface of the via 230 has a structure in direct contact with the first pad 121. In other words, the lower surface of the via 230 filling the inside of the via hole 235 directly contacts the upper surface of the first pad 121.

Accordingly, the lower surface of the via 230 in the first embodiment may be positioned lower than the lower surface of the metal layer 220.

In addition, a side surface of the via 230 may include a first portion in contact with the metal layer 220 and a second portion in contact with the adhesive insulating layer 300. In this case, the via 230 may be formed by filling the via hole 235 with a resin such as epoxy. Alternatively, the via 230 may be formed of a metal material such as copper. In this case, when the first pad 121 and the second pad 240 are to be electrically connected, the via 230 may be formed of a metal material, or alternatively, may be formed of an electrically conductive epoxy.

In addition, when the first pad 121 and the second pad 240 do not need to be electrically connected (eg, a via formed for heat dissipation), the via 230 may be formed of non-conductive epoxy.

Meanwhile, the lower surface of the metal layer 220 may also be treated with a low-roughness surface according to the embodiment, and accordingly, the buffer layer 150 as described above may be disposed. In an embodiment, using the buffer layer 150 as described above, the first substrate 100 and the second substrate 200 may be firmly bonded with the adhesive insulating layer 300 interposed therebetween, and accordingly, reliability may be improved.

An adhesive insulating layer 300 is disposed between the first substrate 100 and the second substrate 200. As the adhesive insulating layer 300, a resin sheet such as resin coated copper (RCC) may be used, or alternatively, a prepreg may be used.

However, in order to improve the bonding strength between the first substrate 100 and the second substrate 200, Dk of the adhesive insulating layer 300 is set to be 3.4 or less, and Df is set to be 0.004 or less.

In this embodiment, the first substrate to which the low-roughness surface treatment technology is applied and the second substrate to which the hole plugging technology is applied are respectively manufactured. Then, an adhesive insulating layer is disposed between the first and second substrates manufactured as described above to bond the first and second substrates. Thereafter, the first pad included in the first substrate is exposed by processing an inside of the via hole of the second substrate while the first substrate and the second substrate are bonded to each other. Then, when the first pad is exposed, a via layer filling the inside of the via hole is formed on the first pad, and a second pad is formed on the via layer. According to this embodiment, signal loss occurring in the high frequency band can be minimized by using the first substrate to which the low-roughness surface treatment technology is applied. In addition, according to this embodiment, heat generated from the first substrate can be efficiently discharged to the outside by combining the second substrate and the first substrate to which the hole plugging technology is applied, and accordingly, the heat dissipation characteristics of the circuit board may be improved. In conclusion, according to the present embodiment, it is possible to provide a circuit board for a 5G antenna module that can be used in a high-frequency band of the circuit board and has very high heat dissipation characteristics.

FIGS. 9 to 13 are views for explaining a manufacturing process of the circuit board shown in FIG. 1.

First, referring to FIG. 9, a first substrate 100 and a second substrate 200 are respectively manufactured as described with reference to the previous drawings. In this case, the second substrate 200 is a substrate before the second pad 240 and the via 230 are formed. That is, the metal layer 220 formed in the via hole 235 of the second substrate 200 is formed together when the second substrate 200 is manufactured, and the second pad 240 and the via 230 are formed after bonding the first substrate 100 and the second substrate 200.

As described above, when the first substrate 100 and the second substrate 200 are respectively manufactured, the adhesive insulating layer 300 is disposed between the first substrate 100 and the second substrate 200. In this case, the adhesive insulating layer 300 may be disposed on the entire region between the first substrate 100 and the second substrate 200.

Next, as shown in FIG. 10, after a compression process is performed in a state in which the adhesive insulating layer 300 is disposed between the first substrate 100 and the second substrate 200, the first substrate 100 and the second substrate 200 may be bonded to each other through a curing process.

In this case, the adhesive insulating layer 300 may be disposed on the entire region between the first substrate 100 and the second substrate 200 as described above. Accordingly, the upper surface of the first pad 121 may be covered by the adhesive insulating layer 300.

Also, the adhesive insulating layer 300 may be disposed between the first pad 121 and the metal layer 220.

Thereafter, as shown in FIG. 11, a hole forming process is performed in the via hole 235 to remove the adhesive insulating layer 300 disposed on the upper surface of the first pad 121, and the upper surface of the first pad 121 may be exposed.

Next, as shown in FIG. 12, a via 230 filling the via hole 235 may be formed on the exposed first pad 121. The upper surface of the via 230 may be positioned on the same plane as an upper surface of the metal layer 220.

When the via 230 is formed, a second pad 240 may be formed on an upper surface of the via 230 and an upper surface of the metal layer 220. Accordingly, the second pad 240 may include a first portion in contact with the metal layer 220 and a second portion in contact with the upper surface of the via 230.

Hereinafter, a modified example of the circuit board of the first embodiment will be described. FIGS. 13 and 14 are views for explaining a method of manufacturing a circuit board according to a second embodiment.

The adhesive insulating layer 300 disposed between the first substrate 100 and the second substrate 200 of the first embodiment was disposed over the entire area between the first substrate 100 and the second substrate 200.

Alternatively, the adhesive insulating layer 300 of the modified example may be disposed on the remaining region except for the region overlapping the lower surface of the metal layer 220 among the entire area between the first substrate 100 and the second substrate 200.

Accordingly, the adhesive insulating layer 300 may not be positioned between the metal layer 220 and the first pad 121, and the adhesive insulating layer 300 may be disposed in a region between the first substrate 100 and the second substrate 200 except between the metal layer 220 and the first pad 121.

The metal layer 220 of the first embodiment and the first pad 121 have a structure in which they do not directly contact each other. Alternatively, the metal layer 220 of the second embodiment and the first pad 121 may have a structure in which they directly contact each other.

Thereafter, as shown in FIG. 14, a hole forming process is performed in the via hole 235 to remove the adhesive insulating layer 300 disposed on the upper surface of the first pad 121, and accordingly, the upper surface of the first pad 121 may be exposed.

Next, a via 230 filling the via hole 235 may be formed on the exposed first pad 121. An upper surface of the via 230 may be positioned on the same plane as a top surface of the metal layer 220. When the via 230 is formed, a second pad 240 may be formed on an upper surface of the via 230 and an upper surface of the metal layer 220. Accordingly, the second pad 240 may include a first portion in contact with the metal layer 220 and a second portion in contact with the top surface of the via 230.

In this embodiment, the first substrate to which the low-roughness surface treatment technology is applied and the second substrate to which the hole plugging technology is applied are respectively manufactured. Then, an adhesive insulating layer is disposed between the first and second substrates manufactured as described above to bond the first and second substrates. Thereafter, the first pad included in the first substrate is exposed by processing an inside of the via hole of the second substrate while the first substrate and the second substrate are bonded to each other. Then, when the first pad is exposed, a via layer filling the inside of the via hole is formed on the first pad, and a second pad is formed on the via layer. According to this embodiment, signal loss occurring in the high frequency band can be minimized by using the first substrate to which the low-roughness surface treatment technology is applied. In addition, according to this embodiment, heat generated from the first substrate can be efficiently discharged to the outside by combining the second substrate and the first substrate to which the hole plugging technology is applied, and accordingly, the heat dissipation characteristics of the circuit board may be improved. In conclusion, according to the present embodiment, it is possible to provide a circuit board for a 5G antenna module that can be used in a high-frequency band of the circuit board and has very high heat dissipation characteristics.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:
a first substrate structure including a first insulating layer and an upper pad disposed on an upper surface of the first insulating layer;
a second substrate structure disposed on the first substrate structure; and
an adhesive layer disposed between the first substrate structure and the second substrate structure,
wherein the second substrate structure includes:
a second insulating layer including a via hole;
a conductive via disposed in the via hole; and
a metal layer including a first part disposed on an upper surface of the second insulating layer, a second part disposed on a lower surface of the second insulating layer, and a third part disposed on an inner wall of the via hole of the conductive via,
wherein the conductive via includes a first via portion disposed in the via hole and overlapping the first to third parts of the metal layer along a horizontal direction, and a second via portion protruding from the first via portion toward the first substrate structure and not overlapping the first to third parts of the metal layer along the horizontal direction and a vertical direction perpendicular to the horizontal direction, and
wherein the adhesive layer includes a first adhesive portion disposed between the first insulating layer and the second insulating layer, and a second adhesive portion disposed between the third part of the metal layer and the upper pad and surrounding the second via portion of the conductive via.

2. The circuit board of claim 1, wherein a thickness of the first adhesive portion of the adhesive layer is greater than a thickness of the third part of the metal layer,
wherein the third part of the metal layer is vertically spaced apart from an upper surface of the upper pad, and
wherein the second adhesive portion of the adhesive layer is disposed between a lower surface of the third part of the metal layer and the upper surface of the upper pad.

3. The circuit board of claim 2, wherein a lower surface of the conductive via is positioned lower than the lower surface of the third part of the metal layer based on a lower surface of the second insulating layer.

4. The circuit board of claim 2, wherein a side surface of the first via portion of the conductive via
is in contact with the metal layer, and
wherein a side surface of the second via portion of the conductive via is in contact with the second adhesive portion of the adhesive layer.

5. The circuit board of claim 4, wherein the second substrate structure includes an additional metal layer disposed on an upper surface of the first part of the metal layer and an upper surface of the first via portion of the conductive via; and
wherein the upper surface of the first via portion of the conductive via is in contact with the additional metal layer.

6. The circuit board of claim 1, wherein the upper pad of the first substrate structure includes:
a first upper pad overlapping the conductive via of the second substrate structure in the vertical direction; and
a second upper pad spaced apart from the first upper pad in the horizontal direction and not overlapping with the conductive via in the vertical direction; and
wherein an upper surface of the second upper pad is covered with the adhesive layer.

7. The circuit board of claim 1, wherein the second adhesive portion of the adhesive layer does not overlap the metal layer along the horizontal direction.

8. The circuit board of claim 1, wherein a width of the first via portion of the conductive via is same as a width of the second via portion of the conductive via.

9. The circuit board of claim 1, wherein an outer surface of the first via portion of the conductive via is located on a same plane as an outer surface of the second via portion of the conductive via.

10. The circuit board of claim 1, wherein a lower surface of the second adhesive portion of the adhesive layer and a lower surface of the second via portion of the conductive via are positioned on a same plane.

11. The circuit board of claim 1, wherein a surface roughness (Ra) of at least one of the upper pad and the metal layer is 0.5 μm or less.

12. A circuit board comprising:
a first substrate structure including a first insulating layer and a first circuit layer disposed on the first insulating layer;
a second substrate structure disposed on the first substrate structure and including a second insulating layer and a second circuit layer disposed on the first insulating layer;
an adhesive layer disposed between the first substrate structure and the second substrate structure; and
a buffer layer disposed between the first insulating layer and the first circuit layer and between the second insulating layer and the second circuit layer,
wherein the buffer layer includes carbon atoms, nitrogen atoms, oxygen atoms, silicon atoms, sulfur atoms, and metal atoms,
a ratio of the carbon atoms to the metal atoms ((carbon atom/copper atom) 100) is 5 to 7,
a ratio of the nitrogen atoms to the metal atoms ((nitrogen atom/copper atom)*100) is 1.5 to 7,
a ratio of the oxygen atoms to the metal atoms ((oxygen atom/copper atom)*100) is 1.1 to 1.9, a ratio of the silicon atoms to the metal atoms ((silicon atom/copper atom)*100) is 0.5 to 0.9, and a ratio of the atoms sulfur to the metal atoms ((sulfur atom/copper atom)*100) is 0.5 to 1.5.

13. The circuit board of claim 12, wherein the carbon atoms, the nitrogen atoms, the oxygen atoms, the silicon atoms, and the sulfur atoms are bonded to each other and exist in a plurality of molecules, wherein the metal atoms exist as a metal ion, wherein the molecules and the metal ion are chemically bonded to each other, and wherein the molecules include a macromolecule and a unimolecule.

14. The circuit board of claim 12, wherein the buffer layer includes a plurality of terminal groups connected to the first or second insulating layer and the first circuit layer or the second circuit layer, and wherein the terminal groups are covalent-bonded or coordinate-bonded to the first insulating layer and the first circuit layer, or the second insulating layer and the second circuit layer.

15. The circuit board of claim 12, wherein the buffer layer does not overlap the first circuit layer and the second circuit layer along a horizontal direction.

16. The circuit board of claim 12, wherein the buffer layer includes a first buffer layer disposed between the first insulating layer, and wherein the first buffer layer includes a first portion that overlaps the first circuit layer along a vertical direction, and a second portion that does not overlap the first circuit layer along the vertical direction.

17. The circuit board of claim 16, wherein the buffer layer includes a second buffer layer disposed between the second insulating layer and the second circuit layer, and wherein the second buffer layer includes a third portion that overlaps the metal second circuit layer along the vertical direction, and a fourth portion that does not overlap the second circuit layer along the vertical direction.

* * * * *